(12) United States Patent
Cloud et al.

(10) Patent No.: US 6,356,500 B1
(45) Date of Patent: Mar. 12, 2002

(54) REDUCED POWER DRAM DEVICE AND METHOD

(75) Inventors: Eugene H. Cloud, Boise, ID (US); Kie Y. Ahn, Chappaqua, NY (US); Leonard Forbes; Paul A. Farrar, both of Corvallis, OR (US); Kevin G. Donohoe, Boise, ID (US); Alan R. Reinberg, Westport, CT (US); David J. Mcelroy, Livingston, TX (US); Luan C. Tran, Meridian, ID (US); Joseph Geusic, Berkeley Heights, NJ (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/643,945

(22) Filed: Aug. 23, 2000

(51) Int. Cl.$^7$ .................................................. G11C 7/00
(52) U.S. Cl. .................... 365/226; 365/230.01; 365/240
(58) Field of Search ................................. 365/226, 229, 365/230.01, 236, 240

(56) References Cited

U.S. PATENT DOCUMENTS

| 5,493,574 A | * | 2/1996 | McKinley | 371/40.1 |
| 5,825,691 A | * | 10/1998 | McClure | 365/189.01 |
| 6,184,067 B1 | * | 2/2001 | Casper | 438/123 |

* cited by examiner

Primary Examiner—David Nelms
Assistant Examiner—Thong Le
(74) Attorney, Agent, or Firm—Dickstein Shapiro Morin & Oshinsky LLP

(57) ABSTRACT

A memory device and method employing a scheme for reduced power consumption is disclosed. By dividing a memory array sector into memory sub arrays, the memory device can provide power to memory sub arrays that need to be powered up or, in the alternative, powered down. This reduces the power consumption and heat generation associated with high speed and high capacity memory devices.

39 Claims, 9 Drawing Sheets

REDUCED POWER DRAM DEVICE AND METHOD

BACKGROUND OF THE INVENTION

I. Field of the Invention

The present invention relates generally to dynamic random access memory (DRAM). More specifically, the present invention relates to an improved memory device, which permits increased memory size with reduced power requirements.

II. Description of the Related Art

Improved manufacturing techniques are constantly being developed to increase the memory capacity of DRAM. These techniques have increased the possible number of transistors and other components on a single silicon chip. However, with increased capacity, the need for reduced power requirements still exists. This is most readily apparent in mobile devices which utilize memory, e.g., laptop computers, cellular telephones, etc.

New DRAM device bus architectures have also increased the speed of DRAM access. However, this increased speed results in greater power consumption and heat generation, which may cause overheating problems. For example, a Rambus DRAM SIMM (single in-line memory module) typically contains a heat sink as an effort to address the overheating problem. Therefore, a DRAM architecture that reduces power consumption would also help alleviate overheating associated with these new faster DRAM devices. Accordingly, there is a need for a memory device having increased memory size, yet reduced power consumption.

SUMMARY OF THE INVENTION

The present invention provides a device and method that permits the use of modern techniques to increase DRAM memory size while reducing power consumption. The present invention utilizes the internal memory sub array partitioning of a DRAM device and provides the capability of independently powering down each internal memory sub array thereby reducing power consumption when memory sub arrays are not being used for a period of time.

BRIEF DESCRIPTION OF THE DRAWINGS

The foregoing and other advantages and features of the invention will become more apparent from the detailed description of preferred embodiments of the invention which are provided below with reference to the accompanying drawings in which.

DETAILED DESCRIPTION OF PREFERRED EMBODIMENTS

Figure 1:
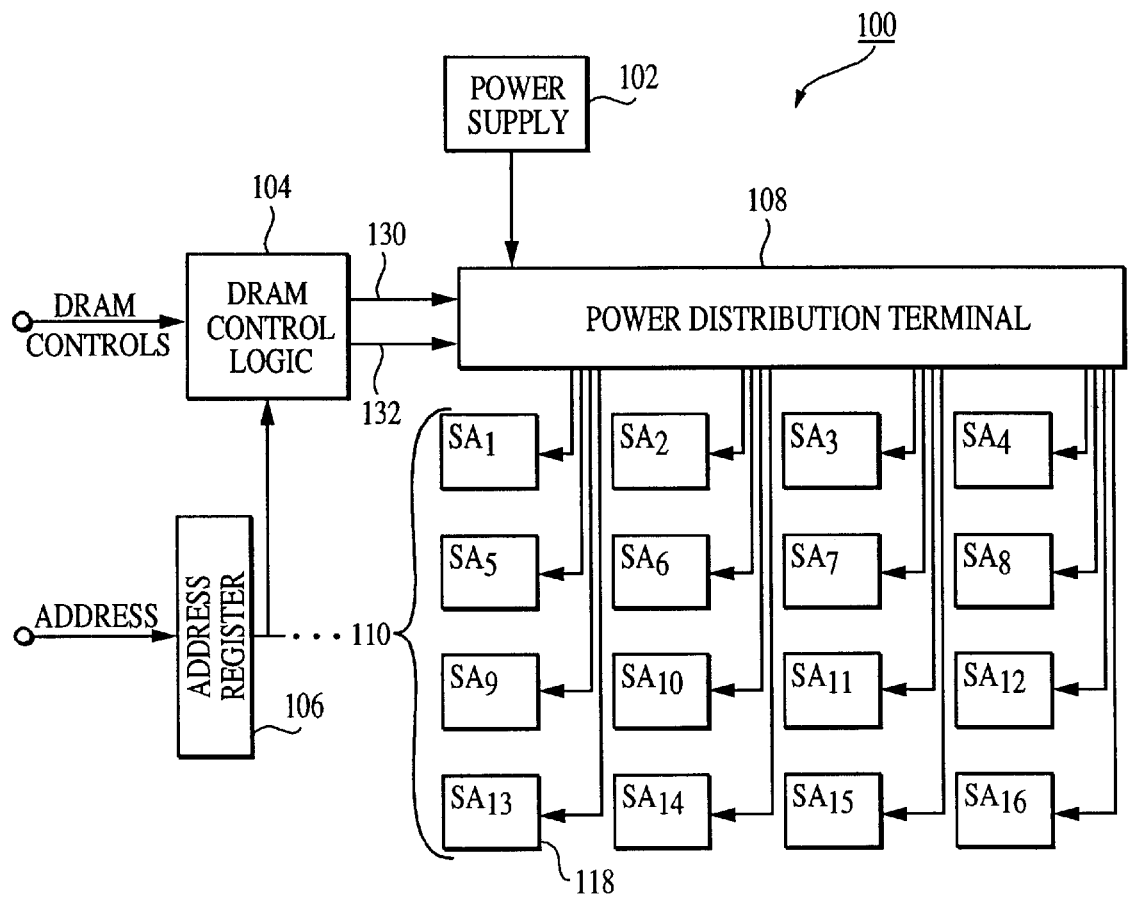
FIG. 1 is a diagram of a DRAM device employing memory sub arrays in accordance with the present invention.
Figure 2:
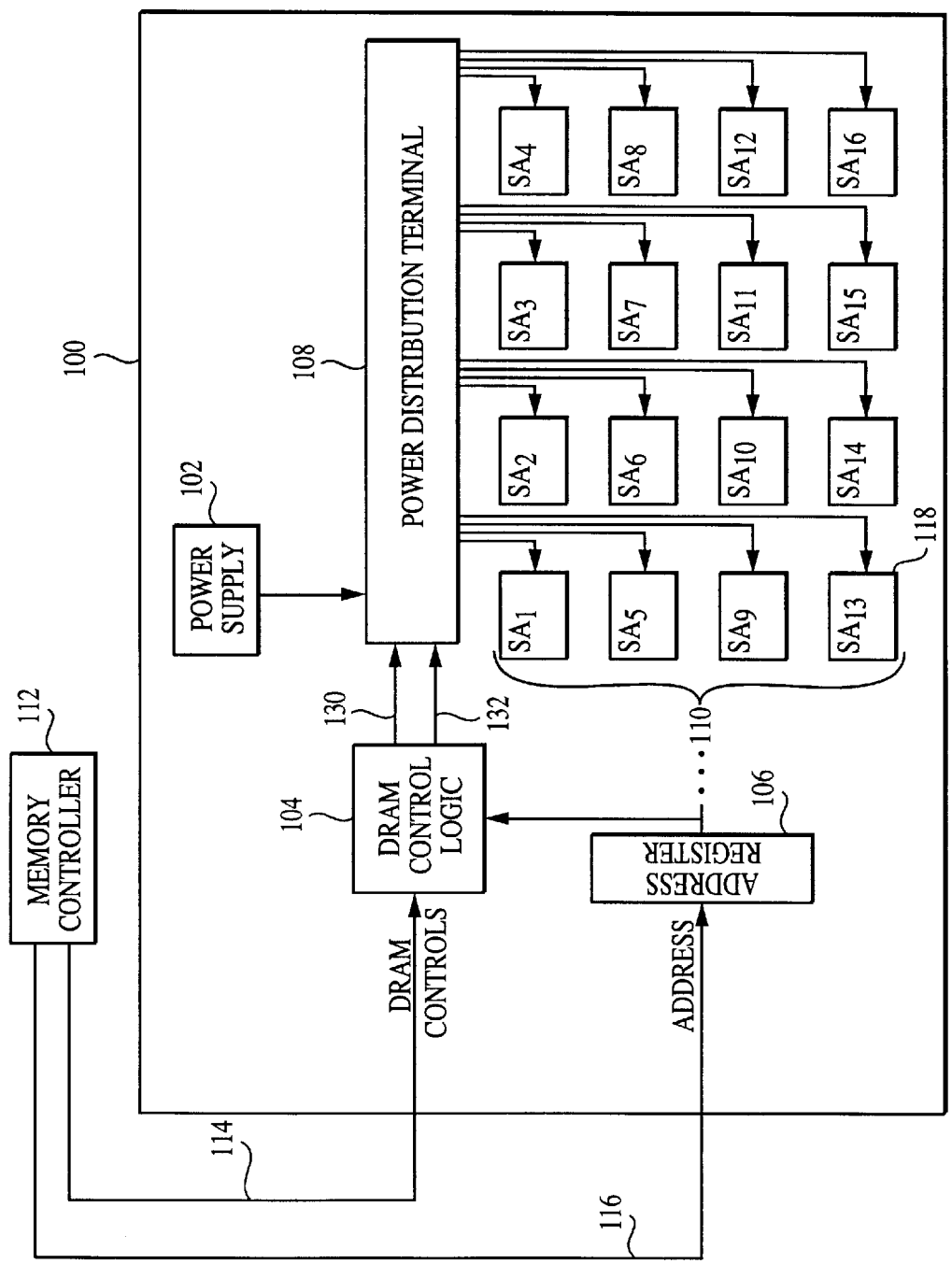
FIG. 2 is a diagram of a DRAM device employing memory sub arrays which uses an external memory controller in accordance with the present invention.

Referring now to the drawings, where like reference numerals designate like elements, there is shown in FIGS. 1 and 2 a relevant portion of a memory device 100 for providing and storing data for data driven devices, e.g., computers, cellular telephones, etc. Memory device 100 includes a power supply 102, an internal DRAM control logic 104, address register 106, power distribution terminal 108 and a plurality of memory array sectors 110. Each memory array sector 110 contains of a plurality of memory sub arrays 118. Memory device 100 may command the memory array sectors 110 itself, as in FIG. 1, or receive memory commands and corresponding memory addresses from an external memory controller 112, as depicted in FIG. 2.

Figure 3A:
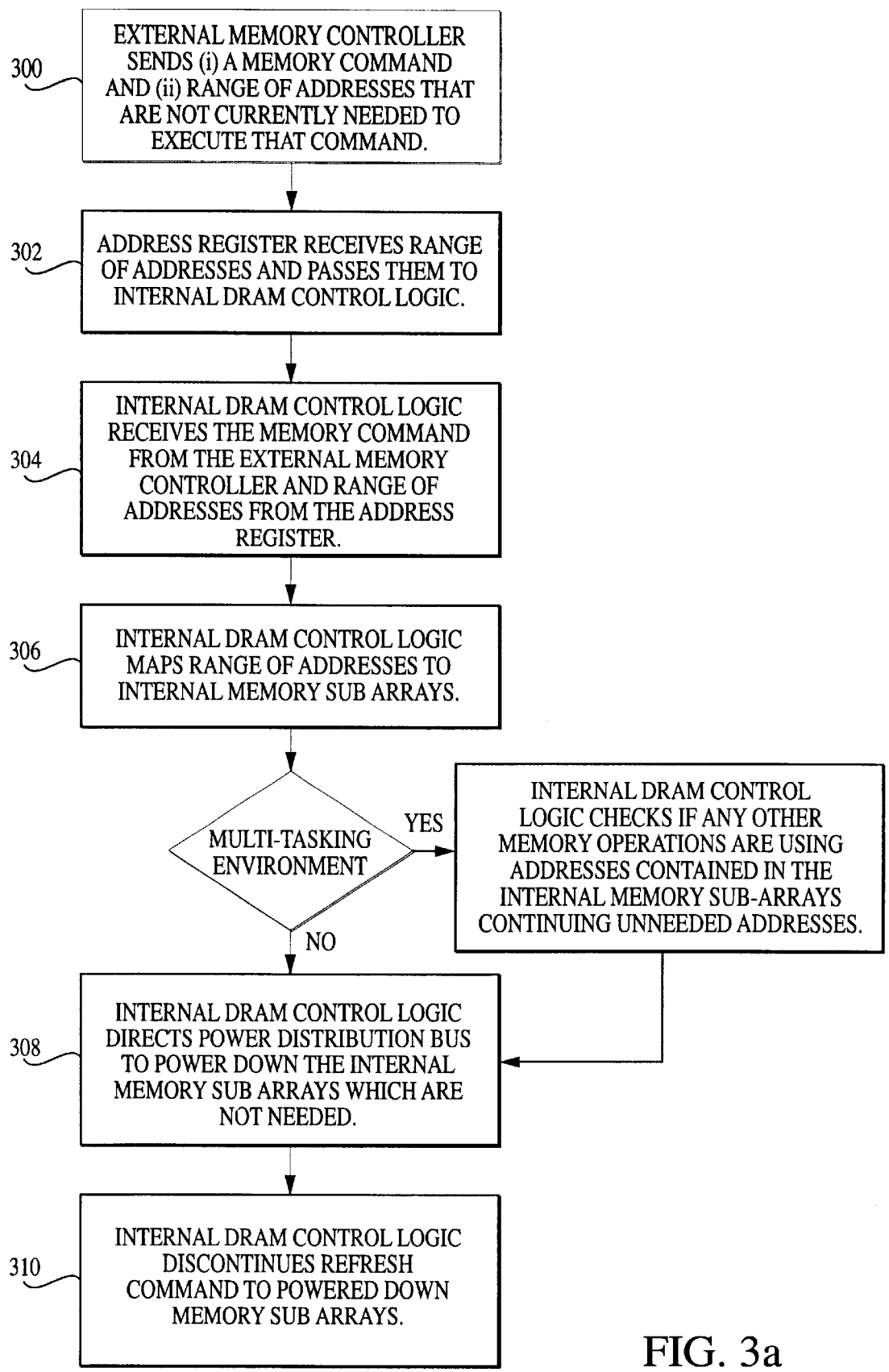
FIG. 3(a) is a flow chart of a method for reducing power consumption of the DRAM device of FIG. 2 by powering down unneeded addresses.
Figure 3B:
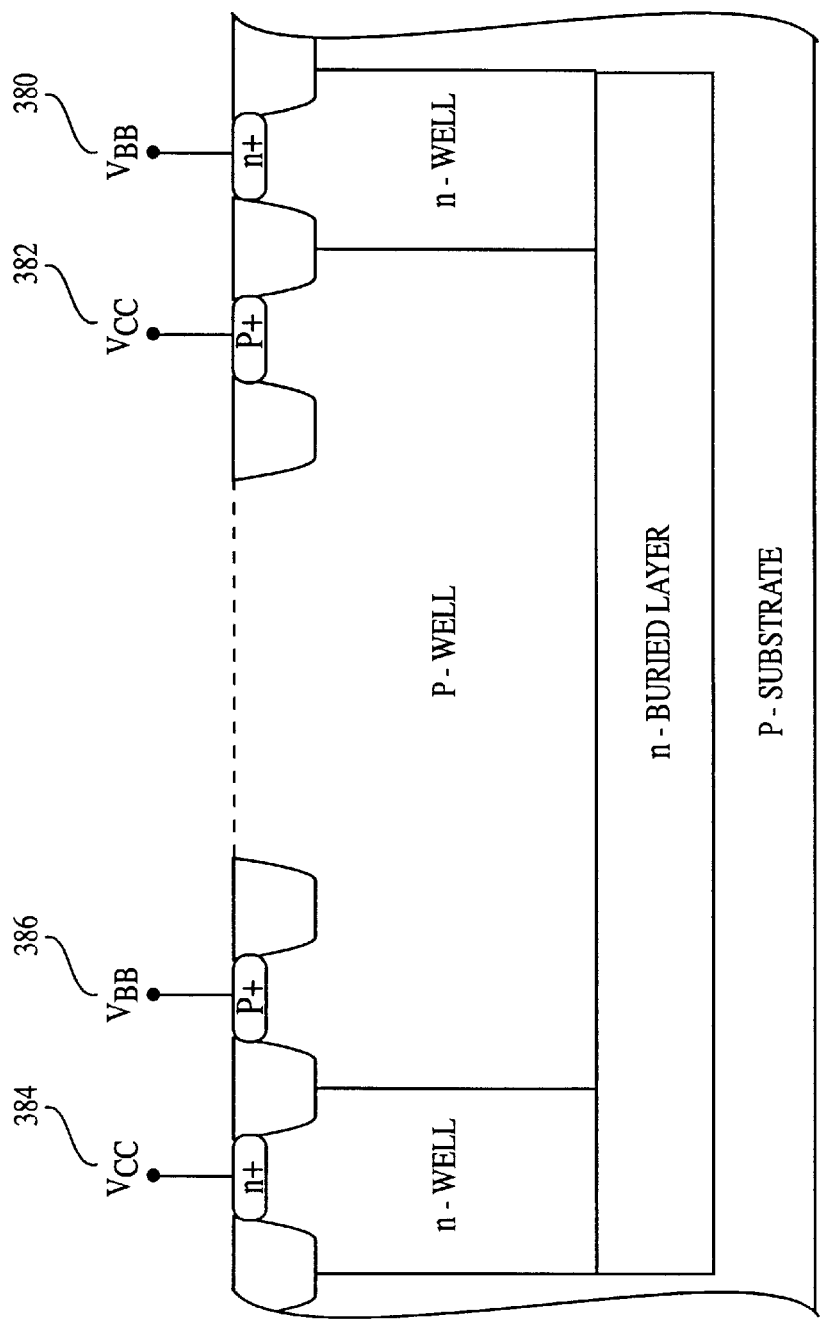
FIG. 3(b) illustrates a cross sectional view of the substrate upon which the DRAM device resides.

FIG. 3(a) illustrates in a first exemplary embodiment of the operation of the memory devices 100 shown in FIGS. 1 and 2 with particular reference to the external memory controller embodiment in FIG. 2. The external memory controller 112 sends a memory command at step 300 to internal DRAM control logic 104 via data control bus 114. A memory command can be a WRITE, READ, etc. Simultaneously with sending the memory command, the external memory controller 112 also sends a range of unneeded addresses for the memory command over address bus 116 to the address register 106 at step 300. The address register 106 simply provides an interface for address information. The address register 106 passes the range of unneeded addresses at step 302 to internal DRAM control logic 104 in the form of data which identifies the range of addresses which require power for execution of the memory command. Given the range of unneeded addresses at step 302, the remaining memory sub arrays 118 are those which are needed for the memory command. The internal DRAM control logic 104 receives and maps (translates) the data indicating the address range(s) of the needed addresses at operational steps 304 and 306. The internal DRAM control logic 104 maps the needed addresses to memory sub arrays 118 which contain the needed addresses. That is, those sub arrays 118 which are needed for the memory operation are identified. The internal DRAM control logic 104, having translated which addresses in the range of addresses correspond to needed memory sub arrays 118 at step 306, sends control signals, via control signal bus 130, to the power distribution terminal 108 at step 308. The control signals instruct the power distribution terminal 108 to power down all sub arrays 118 not designated as needed by the memory command. For purpose of this disclosure, power, which is distributed by the power distribution terminal 108, includes both a source positive voltage (Vcc) and a negative voltage (Vbb). Both Vcc and Vbb are partitioned for each memory sub array 118. It is necessary to partition Vcc and Vbb to isolate each memory sub array 118 on the n-rail and p-rail of the substrate on which the memory device 100 resides, respectively. FIG. 3(b) shows a cross sectional view of a substrate upon which the memory device 100 resides including Vcc terminals 380, 384 and Vbb terminals 382, 386. When power distribution terminal 108 powers down a memory sub-array 118, both a Vcc terminal and a Vbb terminal, for the corresponding memory sub-array 118, are grounded (0 volts).

This is one way in which power consumption is reduced. In addition, the internal DRAM control logic 104 discontinues sending a REFRESH command, which is normally sent via REFRESH bus 132, to the unneeded memory sub arrays 118, that is, the memory sub arrays 118 which are not designated as needed for the memory operation at step 310. In this way overall memory system power consumption is reduced.

For simplicity of explanation, it has been assumed that the memory device 100 is operating in a single tasking environment. In a multi-tasking environment the internal DRAM control logic 104 would check if any other memory commands are using the unneeded memory sub arrays 118 before powering them down. The internal DRAM control logic 104 could complete such a task with a simple truth table which is updated on each clock cycle indicating if a memory sub array 118 is being used by a memory command initiated in a previous clock cycle.

Figure 4:
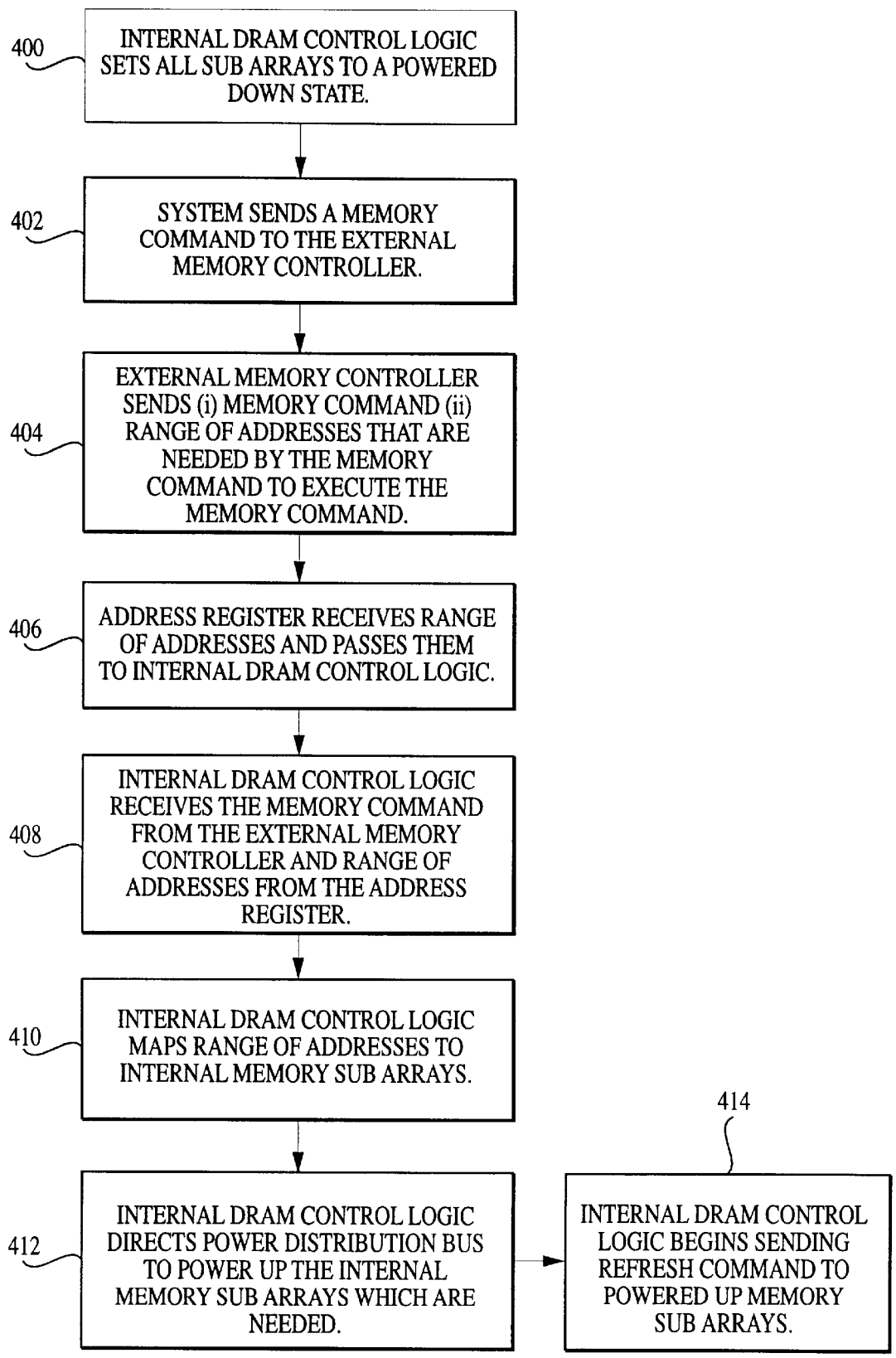
FIG. 4 is a flow chart of a method for reducing power consumption of the DRAM device of FIG. 2 by activating needed addresses.

In another operational embodiment, depicted in FIG. 4, all memory sub arrays 118 are initially powered off as a default condition by the internal DRAM control logic 104 at step 400. At this step the power distribution terminal 108 is instructed, through a control signal sent via control signal bus 130, to cease supplying power to all memory sub arrays 118. In addition, as a consequence of all memory sub arrays 118 not being supplied power, the internal DRAM control logic 104 does not send the REFRESH command, which is normally sent via REFRESH bus 132, to any memory sub arrays 118. When a memory function is needed, the external memory controller 112 sends a memory command, which effectuates the desired memory function, on data control bus 114 at step 404. Simultaneously with sending the memory command, the external memory controller 112 also sends a range of addresses needed for the memory command over address bus 116 to the address register 106 at step 404. The address register 106 simply provides an interface for address information. The address register 106 receives and passes the range of needed addresses to internal DRAM control logic 104 at step 406 in the form of data which identifies the range of addresses which require power for execution of the memory command. After receiving the memory command and data identifying the range of needed addresses in step 408, the internal DRAM control logic 104 maps (translates) the address range of the needed addresses to memory sub arrays 118 which contain the needed addresses in step 410. That is, those sub arrays 118 which are needed for the memory operation are identified. The internal DRAM control logic 104, having translated which addresses in the range of addresses correspond to needed memory sub arrays 118, sends control signals to the power distribution terminal 108 at step 412. The control signals instruct the power distribution terminal 108 to power up the memory sub arrays 118 needed for the memory command at step 412. In addition, the internal DRAM control logic 104 begins sending the REFRESH command only for the needed memory sub arrays 118 at step 414.

Figure 5A:
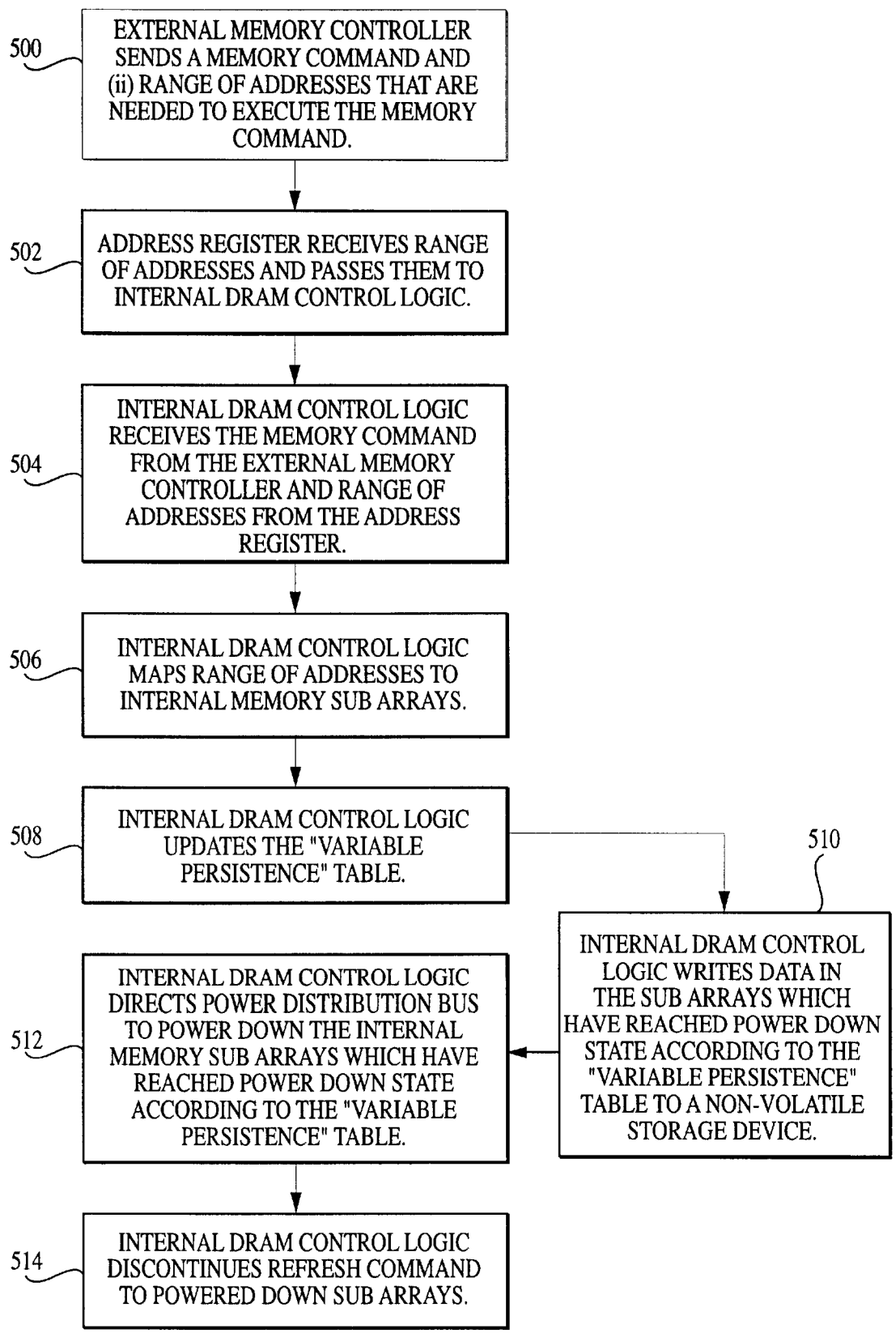
FIG. 5(a) is a flow chart of a method for reducing power consumption of the DRAM device of FIG. 2 by using a "variable persistence" technique.
Figure 5B:
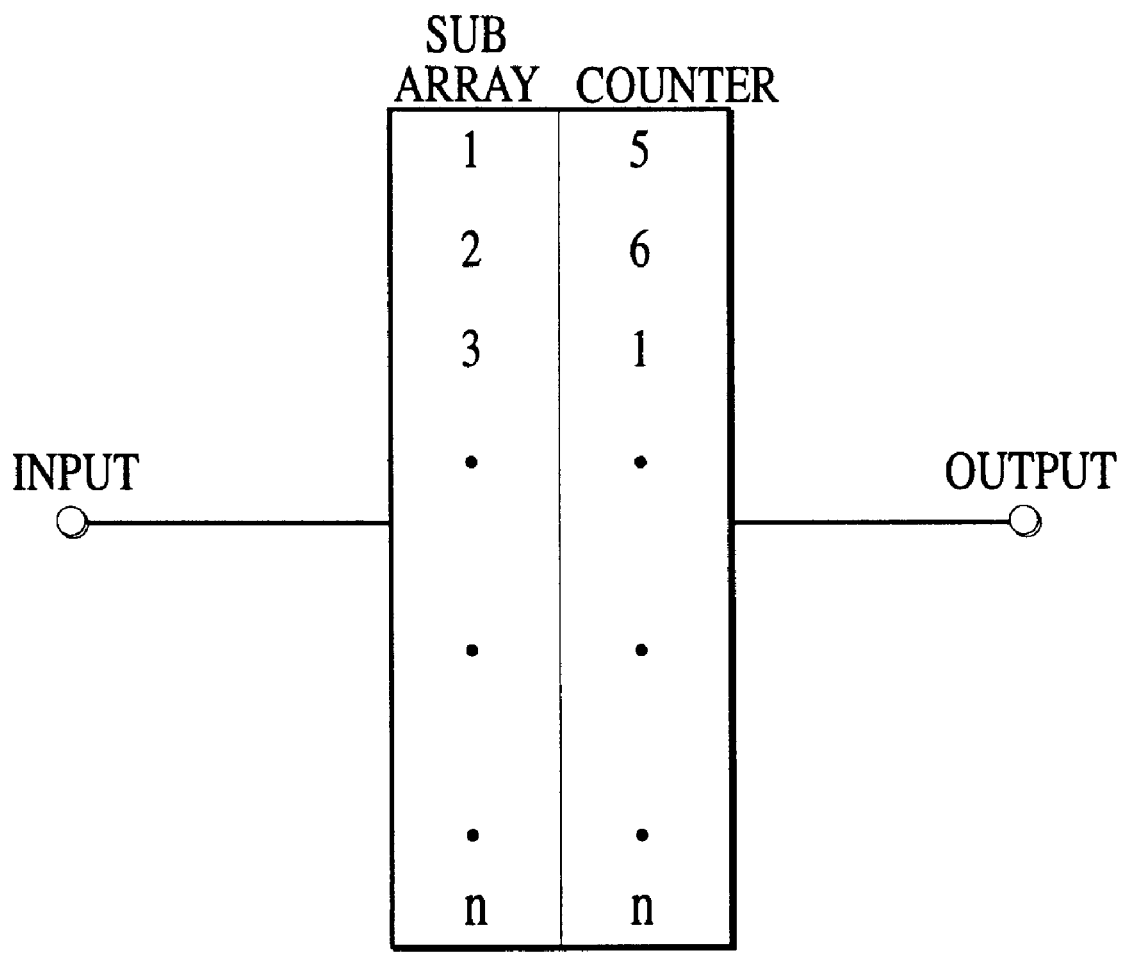
FIG. 5(b) is an illustration of a table used to employ the "variable persistence" technique of FIG. 5(a)

FIG. 5(*a*) illustrates yet another exemplary embodiment of operation which employs a "variable persistence" technique. When a memory function is needed the external memory controller 112 sends a memory command, which effectuates the desired memory function, on data control bus 114 at step 500. Simultaneously with sending the memory command, the external memory controller 112 also sends a range of addresses needed for the memory command over address bus 116 to the address register 106 at step 500. The address register 106 simply provides an interface for address information. The address register 106 receives and passes the range of needed addresses to internal DRAM control logic 104 at step 502 in the form of data which identifies the range of addresses which require power for execution of the memory command. After receiving the memory command and data identifying the range of needed addresses in step 504, the internal DRAM control logic 104 maps (translates) the address range of the needed addresses to memory sub arrays 118 which contain the needed addresses in step 506. That is, those sub arrays 118 which are needed for the memory operation are identified. The internal DRAM control logic 104, having translated which addresses in the range of addresses correspond to needed memory sub arrays 118, under this "variable persistence" technique, updates a "variable persistence" table at step 508. The "variable persistence" table, shown in FIG. 5(*b*), is maintained by the internal DRAM control logic 104. The table includes a counter for each memory sub array 118, which corresponds to a memory address range, indicating the number of memory clock cycles which have passed since each memory sub array 118 was last accessed, e.g. to perform a READ, WRITE operation, etc. When the counter for a memory sub array 118 reaches a predetermined memory clock cycle number, e.g., 1000, then the memory sub array 118 in question will be powered down since it is not being used at step 512. The predetermined number can be, for example, the number of clock cycles equivalent to one minute, where one could fairly assume a memory sub array 118 is not going to be used in the immediate future if it has been idle for one minute. Prior to instructing the power distribution terminal 108 to power down those memory sub arrays 118 which have exceeded the allowable time on the counter and discontinuing the REFRESH function at steps 512 and 514, the internal DRAM control logic 104 will cause the data from those memory sub arrays 118 to be written back to a non-volatile storage device, e.g. hard drive at step 510. In the alternative, the internal DRAM control logic 104 can power those memory sub array 118 to less than full power and maintain its REFRESH function. While the later technique does not conserve as much power as the previous technique, it allows for a quicker response time as data may not need to be written and then re-retrieved from a non-volatile storage device, which is typically slower then a volatile memory device such as memory device 100.

Figure 6:
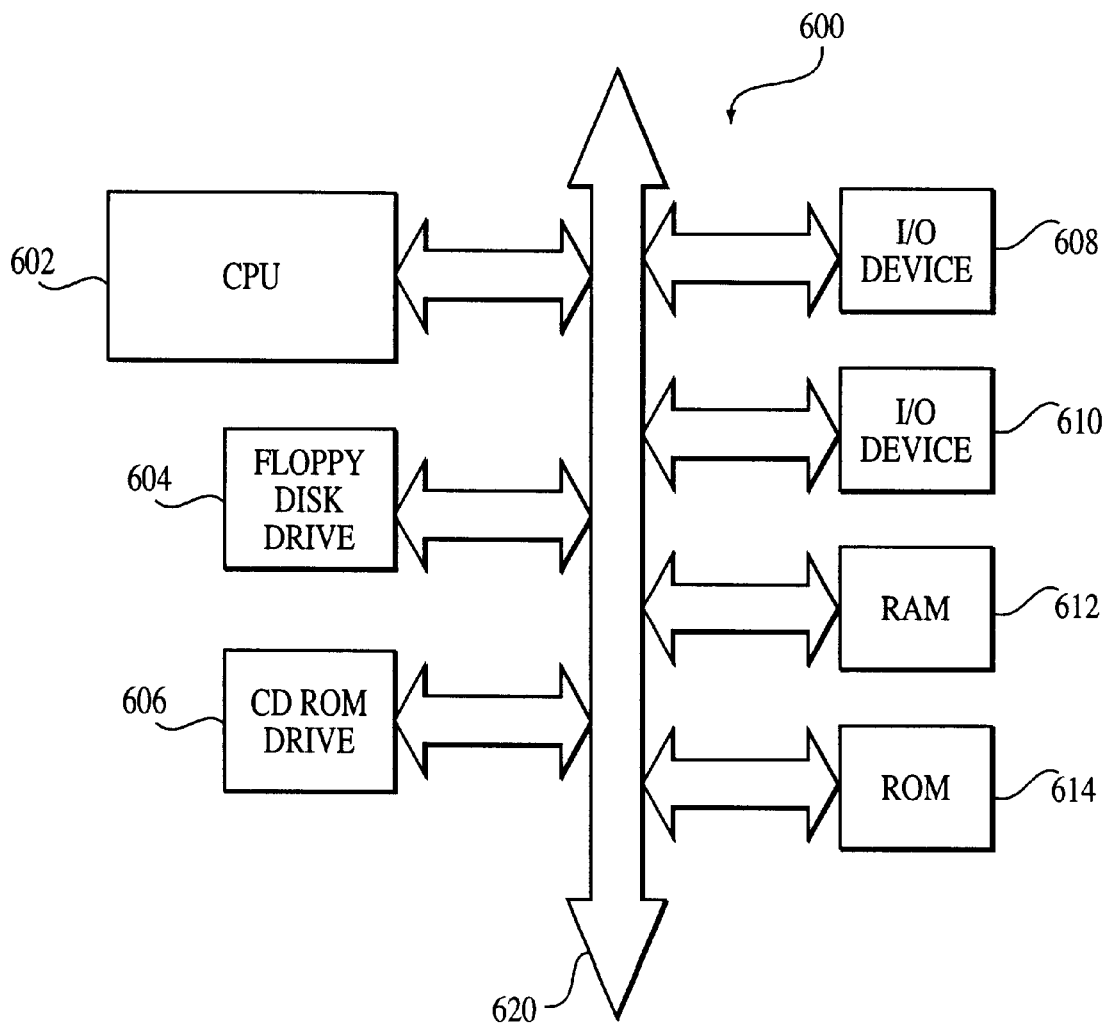
FIG. 6 is an illustration of a processor-based system employing the reduced power consumption device and method of the present invention.

FIG. 6 illustrates a processor system 600, including memory device 612 constructed in accordance with the present invention as described above with reference to FIGS. 2–5. The processor system 600 may be a computer system, a process control system or any other system employing a processor and associated memory devices. The processor system includes a central processing unit (CPU) 602, e.g., microprocessor, that communicates with input/output devices 608, 610, floppy drive 604, memory device 614 and CD ROM drive 606 over a bus 620. The CPU 602 and memory device 612 may be provided on a single integrated circuit chip.

Figure 7:
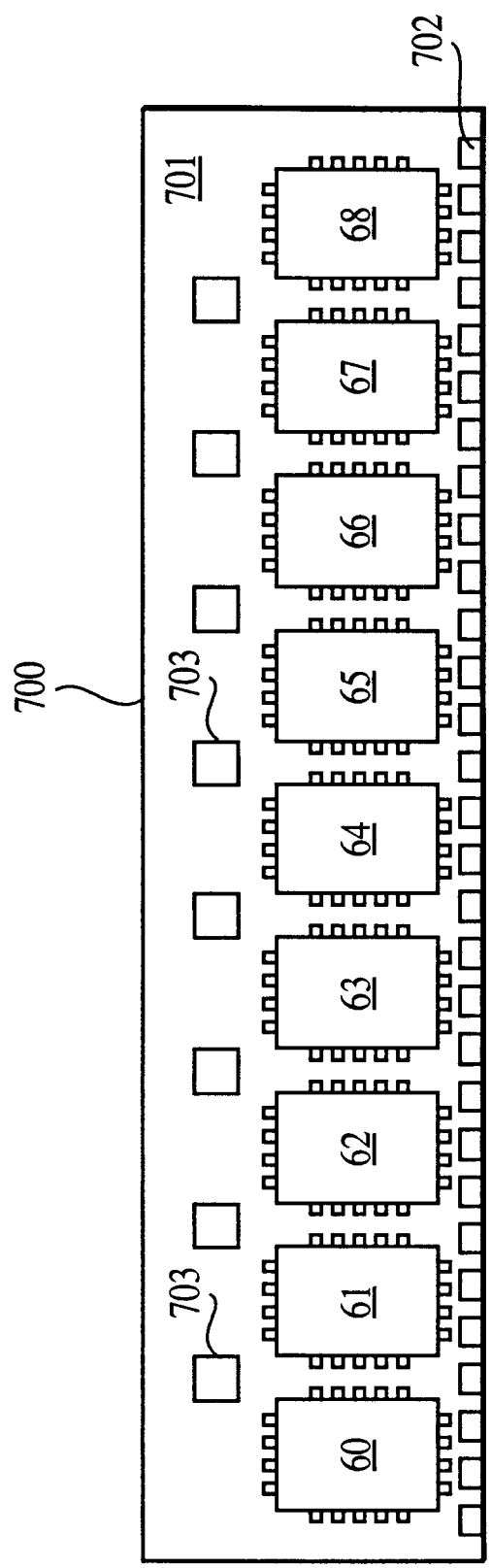
FIG. 7 is an illustration of a memory module employing the reduced power consumption device and method of the present invention.

FIG. 7 shows a memory module 700 having memory chips 60–68 with semiconductor memory devices constructed in accordance with the present invention as described above with reference to FIGS. 2–5. Memory module 700 is a SIMM (single in line memory module) having nine memory chips (IC's) 60–68 aligned on one side of a printed circuit board substrate. Memory chips 60–68 employ the reduced power consumption structure and method of the present invention.

It is to be understood that the above description is intended to be illustrative and not restrictive of the invention. Many variations to the above-described device and method including substitution of equivalent steps and structures will be readily apparent to those having ordinary skill in the art. Accordingly, the present invention is not to be considered as limited by the specifics of the particular devices and methods, which have been described and illustrated, but is only limited by the scope of the appended claims.

What is claimed as new and desired to be protected by Letters Patent of the United States is:

1. A memory device comprising:
    a plurality of memory sub arrays;
    a power distribution terminal coupled to said plurality of memory sub arrays, said power distribution terminal selectively providing power to said plurality of memory sub arrays; and
    internal memory control logic coupled to said power distribution terminal, said internal memory control logic receiving a memory command and data which identifies a range of addresses required for said memory command and identifying which ones of said plurality of memory sub arrays contain said addresses within said range, said internal memory control logic causing said power distribution terminal to supply power only to said plurality of memory sub arrays containing said addresses in said range.

2. The device of claim 1, wherein said data contains a range of addresses which are not needed to execute said memory command.

3. The device of claim 1, wherein said data contains a range of addresses which are needed to execute said memory command.

4. The device of claims 1, 2 or 3, wherein said internal memory control logic includes a table which comprises a plurality of counters respectively corresponding to said plurality of memory sub arrays, each of said plurality of counters indicating a period of time which has elapsed since each corresponding memory sub array was last accessed, said internal memory control logic updating said counters in accordance with said data, said internal memory control logic instructing said power distribution terminal to cease power to a particular memory sub array where said counter corresponding to said particular memory sub array reaches a predetermined value.

5. The device of claim 1 further comprising an external memory controller for sending said memory command to said internal memory control logic.

6. The device of claim 5 further comprising an address register for receiving said range of addresses from said external memory controller and sending said data which identifies said range of addresses required for said memory command to said internal memory control logic.

7. The device of claim 3 further comprising a refresh command bus, wherein said internal memory control logic sends a refresh command over said refresh command bus to said power distribution terminal for said plurality of memory sub arrays containing said range of addresses.

8. The device of claim 2 further comprising a refresh command bus, wherein said internal memory control logic disables the transmission of a refresh command over said refresh command bus to said power distribution terminal for said plurality of memory sub arrays containing said range of addresses.

9. A memory module comprising:
    at least one memory chip, said at least one memory chip comprising:
        a plurality of memory sub arrays;
        a power distribution terminal coupled to said plurality of memory sub arrays, said power distribution terminal selectively providing power to said plurality of memory sub arrays; and
        internal memory control logic coupled to said power distribution terminal, said internal memory control logic receiving a memory command and data which identifies a range of addresses required for said memory command and identifying which ones of said plurality of memory sub arrays contain said addresses within said range, said internal memory control logic causing said power distribution terminal to supply power only to said plurality of memory sub arrays containing said addresses in said range.

10. The module of claim 9, wherein said data contains a range of addresses which are not needed to execute said memory command.

11. The module of claim 9, wherein said data contains a range of addresses which are needed to execute said memory command.

12. The module of claims 9, 10 or 11, wherein said internal memory control logic includes a table which comprises a plurality of counters respectively corresponding to said plurality of memory sub arrays, each of said plurality of counters indicating a period of time which has elapsed since each corresponding memory sub array was last accessed, said internal memory control logic updating said counters in accordance with said data, said internal memory control logic instructing said power distribution terminal to cease power to a particular memory sub array where said counter corresponding to said particular memory sub array reaches a predetermined value.

13. The module of claim 9 further comprising an external memory controller for sending said memory command to said internal memory control logic.

14. The module of claim 13 further comprising an address register for receiving said range of addresses from said external memory controller and sending said data which identifies said range of addresses required for said memory command to said internal memory control logic.

15. The module of claim 11 further comprising a refresh command bus, wherein said internal memory control logic sends a refresh command over said refresh command bus to said power distribution terminal for said plurality of memory sub arrays containing said range of addresses.

16. The module of claim 10 further comprising a refresh command bus, wherein said internal memory control logic disables the transmission of a refresh command over said refresh command bus to said power distribution terminal for said plurality of memory sub arrays containing said range of addresses.

17. A processor system comprising:
    a processor; and
    a memory device coupled to said processor, said memory device comprising:
        a plurality of memory sub arrays;
        a power distribution terminal coupled to said plurality of memory sub arrays, said power distribution terminal selectively providing power to said plurality of memory sub arrays; and
        internal memory control logic coupled to said power distribution terminal, said internal memory control logic receiving a memory command and data which identifies a range of addresses required for said memory command and identifying which ones of said plurality of memory sub arrays contain said addresses within said range, said internal memory control logic causing said power distribution terminal to supply power only to said plurality of memory sub arrays containing said addresses in said range.

18. The system of claim 17, wherein said data contains a range of addresses which are not needed to execute said memory command.

19. The system of claim 17, wherein said data contains a range of addresses which are needed to execute said memory command.

20. The system of claims 17, 18 or 19, wherein said internal memory control logic includes a table which comprises a plurality of counters respectively corresponding to said plurality of memory sub arrays, each of said plurality of counters indicating a period of time which has elapsed since each corresponding memory sub array was last accessed, said internal memory control logic updating said counters in accordance with said data, said internal memory control logic instructing said power distribution terminal to cease power to a particular memory sub array where said counter corresponding to said particular memory sub array reaches a predetermined value.

21. The system of claim 17 further comprising an external memory controller for sending said memory command to said internal memory control logic.

22. The system of claim 21 further comprising an address register for receiving said range of addresses from said external memory controller and sending said data which identifies said range of addresses required for said memory command to said internal memory control logic.

23. The system of claim 19 further comprising a refresh command bus, wherein said internal memory control logic sends a refresh command over said refresh command bus to said power distribution terminal for said plurality of memory sub arrays containing said range of addresses.

24. The system of claim 18 further comprising a refresh command bus, wherein said internal memory control logic disables the transmission of a refresh command over said refresh command bus to said power distribution terminal for said plurality of memory sub arrays containing said range of addresses.

25. A method of operating a memory device, said method comprising:

receiving a memory command and data which identifies a range of addresses required for said memory command within a memory device;

identifying which of a plurality of memory sub arrays contains said addresses within said range; and supplying power to said identified memory sub arrays which contains said addresses within said range.

26. The method of claim 25 further comprising receiving a range of addresses not needed to execute said memory command and using said range of addresses not needed to define said data which identifies a range of addresses required for said memory command.

27. The method of claim 26 further comprising powering down ones of said plurality of memory sub arrays which are not needed for said memory command.

28. The method of claim 26 further comprising disabling the transmission of a refresh command for ones of said plurality of memory sub arrays which are not needed for said memory command.

29. The method of claim 25 further comprising powering down all of said plurality of memory sub arrays as an initial step.

30. The method of claim 25 further comprising disabling the transmission of a refresh command to all of said plurality of memory sub arrays as an initial step.

31. The method of claims 25, 29 or 30 further comprising receiving a range of addresses needed to execute said memory command and using said range of addresses needed to define said data which identifies a range of addresses required for said memory command.

32. The method of claim 29 further comprising supplying power to ones of said plurality of memory sub arrays which are needed for said memory command.

33. The method of claim 30 further comprising enabling the transmission of a refresh command for ones of said plurality of memory sub arrays which are needed for said memory command.

34. The method of claim 25 further comprising resetting a plurality of counters in a table, wherein said plurality of counters indicate a period of time which has elapsed since a respective one of said plurality of memory sub arrays was last accessed.

35. The method of claim 34 further comprising incrementing said plurality of counters when a respective one of said plurality of memory sub arrays has been accessed.

36. The method of claim 34 further comprising powering down ones of said plurality of memory sub arrays which said plurality of counters indicates has not been accessed for a predetermined period of time.

37. The method of claim 34 further comprising reducing the power provided to ones of said plurality of memory sub arrays which said plurality of counters indicates have been not been accessed for a predetermined time period.

38. The method of claim 36 or 37, wherein said predetermined time period is one minute.

39. The method of claim 36 further comprising writing the data contained in ones of said plurality of memory sub arrays to be powered down to a non-volatile storage device prior to powering down.

* * * * *